(12) United States Patent
Shimizu

(10) Patent No.: US 10,477,098 B2
(45) Date of Patent: Nov. 12, 2019

(54) CONTROL APPARATUS WHICH SETS DEFOCUS AMOUNT USED FOR FOCUSING, IMAGE CAPTURING APPARATUS, CONTROL METHOD, AND STORAGE MEDIUM

(71) Applicant: CANON KABUSHIKI KAISHA, Tokyo (JP)

(72) Inventor: Yusuke Shimizu, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/955,842

(22) Filed: Apr. 18, 2018

(65) Prior Publication Data
US 2018/0309925 A1  Oct. 25, 2018

(30) Foreign Application Priority Data

Apr. 24, 2017  (JP) .................. 2017-085061

(51) Int. Cl.
| | | |
|---|---|---|
| *H04N 5/232* | (2006.01) | |
| *G02B 7/09* | (2006.01) | |
| *G02B 7/14* | (2006.01) | |
| *H01L 27/146* | (2006.01) | |
| *G02B 7/10* | (2006.01) | |
| *G02B 7/36* | (2006.01) | |

(52) U.S. Cl.
CPC .......... *H04N 5/23212* (2013.01); *G02B 7/09* (2013.01); *G02B 7/102* (2013.01); *G02B 7/14* (2013.01); *G02B 7/365* (2013.01); *H01L 27/14643* (2013.01); *H04N 5/23209* (2013.01); *H04N 5/232122* (2018.08)

(58) Field of Classification Search
CPC ...... H04N 5/23212; G02B 7/09; G02B 7/102; G02B 7/14; H01L 27/14643
See application file for complete search history.

(56) References Cited

U.S. PATENT DOCUMENTS

| | | | | |
|---|---|---|---|---|
| 6,271,883 B1 * | 8/2001 | Iijima | ................ | H04N 5/23212 348/345 |
| 2001/0012074 A1 * | 8/2001 | Ohkawara | .......... | H04N 5/23212 348/240.3 |

(Continued)

FOREIGN PATENT DOCUMENTS

JP  2016-057546 A  4/2016

*Primary Examiner* — Nicholas G Giles
(74) *Attorney, Agent, or Firm* — Cowan, Liebowitz & Latman, P.C.

(57) ABSTRACT

An image capturing apparatus includes an acquirer configured to acquire a first signal and a second signal from different pupil areas in an image capturing optical system, a calculator configured to calculate a first defocus amount based on the first signal and the second signal in a first frequency band after each filter process by a plurality of filter processes, and to calculate a second defocus amount and a second reliability based on the first signal and the second signal in a second frequency band higher than the first frequency band, and a controller configured to select a defocus amount used for focusing among a plurality of defocus amounts based on the second reliability. The controller selects the second defocus amount as a defocus amount used for the focusing when the second reliability is equal to or higher than a first reference reliability.

17 Claims, 9 Drawing Sheets

(56) References Cited

U.S. PATENT DOCUMENTS

| | | | | |
|---|---|---|---|---|
| 2012/0092545 | A1* | 4/2012 | Sugawara | G02B 7/285 |
| | | | | 348/345 |
| 2013/0010179 | A1* | 1/2013 | Takahara | G02B 7/36 |
| | | | | 348/353 |
| 2015/0009383 | A1* | 1/2015 | Fujii | H04N 5/347 |
| | | | | 348/302 |
| 2015/0207984 | A1* | 7/2015 | Hamano | H04N 5/23212 |
| | | | | 348/349 |
| 2015/0234148 | A1* | 8/2015 | Kusaka | G02B 7/34 |
| | | | | 348/349 |
| 2015/0316833 | A1* | 11/2015 | Watanabe | G02B 7/28 |
| | | | | 348/345 |
| 2015/0350527 | A1* | 12/2015 | Hamano | H04N 5/23212 |
| | | | | 348/231.99 |
| 2016/0006948 | A1* | 1/2016 | Takao | H04N 5/2628 |
| | | | | 348/345 |
| 2016/0198107 | A1* | 7/2016 | Yamazaki | G02B 7/38 |
| | | | | 348/350 |
| 2016/0269617 | A1* | 9/2016 | Tomita | G02B 7/36 |
| 2016/0295122 | A1* | 10/2016 | Ishii | H04N 5/23212 |
| 2018/0063412 | A1* | 3/2018 | Uenishi | H04N 5/23212 |

* cited by examiner

NON-IMAGE CAPTURING PLANE PHASE DIFFERENCE METHOD PIXEL CONFIGURATION

| R  | Gr | R  | Gr | R  | Gr | R  | Gr |
|----|----|----|----|----|----|----|----|
| Gb | B  | Gb | B  | Gb | B  | Gb | B  |

FIG. 2A

IMAGE CAPTURING PLANE PHASE DIFFERENCE METHOD PIXEL CONFIGURATION

| R A | R B | Gr A | Gr B | R A | R B | Gr A | Gr B | R A | R B | Gr A | Gr B | R A | R B | Gr A | Gr B |
|-----|-----|------|------|-----|-----|------|------|-----|-----|------|------|-----|-----|------|------|
| Gb A | Gb B | B A | B B | Gb A | Gb B | B A | B B | Gb A | Gb B | B A | B B | Gb A | Gb B | B A | B B |

FIG. 2B

CONTROL APPARATUS WHICH SETS DEFOCUS AMOUNT USED FOR FOCUSING, IMAGE CAPTURING APPARATUS, CONTROL METHOD, AND STORAGE MEDIUM

BACKGROUND OF THE INVENTION

Field of the Invention

The present invention relates to an image capturing apparatus that provides a focus control in accordance with a phase difference detection method.

Description of the Related Art

A conventionally known image capturing apparatus provides a focus detection in accordance with the phase difference detection method (image capturing plane phase difference detection method) using an output signal from an image sensor configured to capture an object image. However, the phase difference detection method that contains the image capturing plane phase difference detection method obtains a smaller image signal and has a more inaccurate focus control when capturing a low contrast object, such as a human face, under a low luminance state, such as backlight, than when capturing an image of a high luminance and high contrast object.

Japanese Patent Laid-Open No. ("JP") 2016-57546 discloses an image capturing apparatus that compares an evaluation value (an evaluation value used for a focus control) output when a defocus amount is calculated with a preset threshold, and evaluates the reliability of the defocus amount.

However, the image capturing apparatus disclosed in JP 2016-57546 does not directly calculate detection scatters of the defocus amount, and the evaluation value changes in accordance with the setting in the image capturing apparatus, such as a F-number, and an object, such as a luminance and a contrast. Thus, in capturing a low luminance or low contrast object, the accuracy of the evaluation value may lower.

SUMMARY OF THE INVENTION

The present invention provides a control apparatus, an image capturing apparatus, a control method, and a storage medium, which can provide an accurate focus control in capturing a low luminance or low contrast object.

An image capturing apparatus according to one aspect of the present invention includes an acquirer configured to acquire a first signal and a second signal corresponding to light fluxes that have passed different pupil areas in an image capturing optical system, a calculator configured to calculate a first defocus amount based on the first signal and the second signal in a first frequency band after each filter process by a plurality of filter processes having different bands for the first signal and the second signal, and to calculate a second defocus amount and a second reliability based on the first signal and the second signal in a second frequency band higher than the first frequency band, and a controller configured to select a defocus amount used for focusing among a plurality of defocus amounts based on the second reliability. The controller selects the second defocus amount as a defocus amount used for the focusing when the second reliability is equal to or higher than a first reference reliability.

An image capturing apparatus according to another aspect of the present invention includes an image sensor that includes a first photoelectric converter and a second photoelectric converter configured to receive light fluxes that have passed different pupil areas in an image capturing optical system, and the above controller.

A control method according to still another aspect of the present invention includes an acquiring step configured to acquire a first signal and a second signal corresponding to light fluxes that have passed different pupil areas in an image capturing optical system, a calculating step configured to calculate a first defocus amount based on the first signal and the second signal in a first frequency band after each filter process by a plurality of filter processes having different bands for the first signal and the second signal, and to calculate a second defocus amount and a second reliability based on the first signal and the second signal in a second frequency band higher than the first frequency band, and a selecting step configured to select a defocus amount used for focusing among a plurality of defocus amounts based on the second reliability. The selecting step selects the second defocus amount as a defocus amount used for the focusing when the second reliability is equal to or higher than a first reference reliability.

A non-transitory storage medium according to another aspect of the present invention storing a program that enables a computer to execute the above control method.

Further features of the present invention will become apparent from the following description of exemplary embodiments with reference to the attached drawings.

BRIEF DESCRIPTION OF THE DRAWINGS

FIG. 2A illuminates a pixel configuration example in accordance with a non-image capturing plane phase difference method.

FIG. 2B illuminates a pixel configuration example in accordance with an image capturing plane phase difference method.

DESCRIPTION OF THE EMBODIMENTS

Referring now to the accompanying drawings, a description will be given of the present invention.

Figure 1:
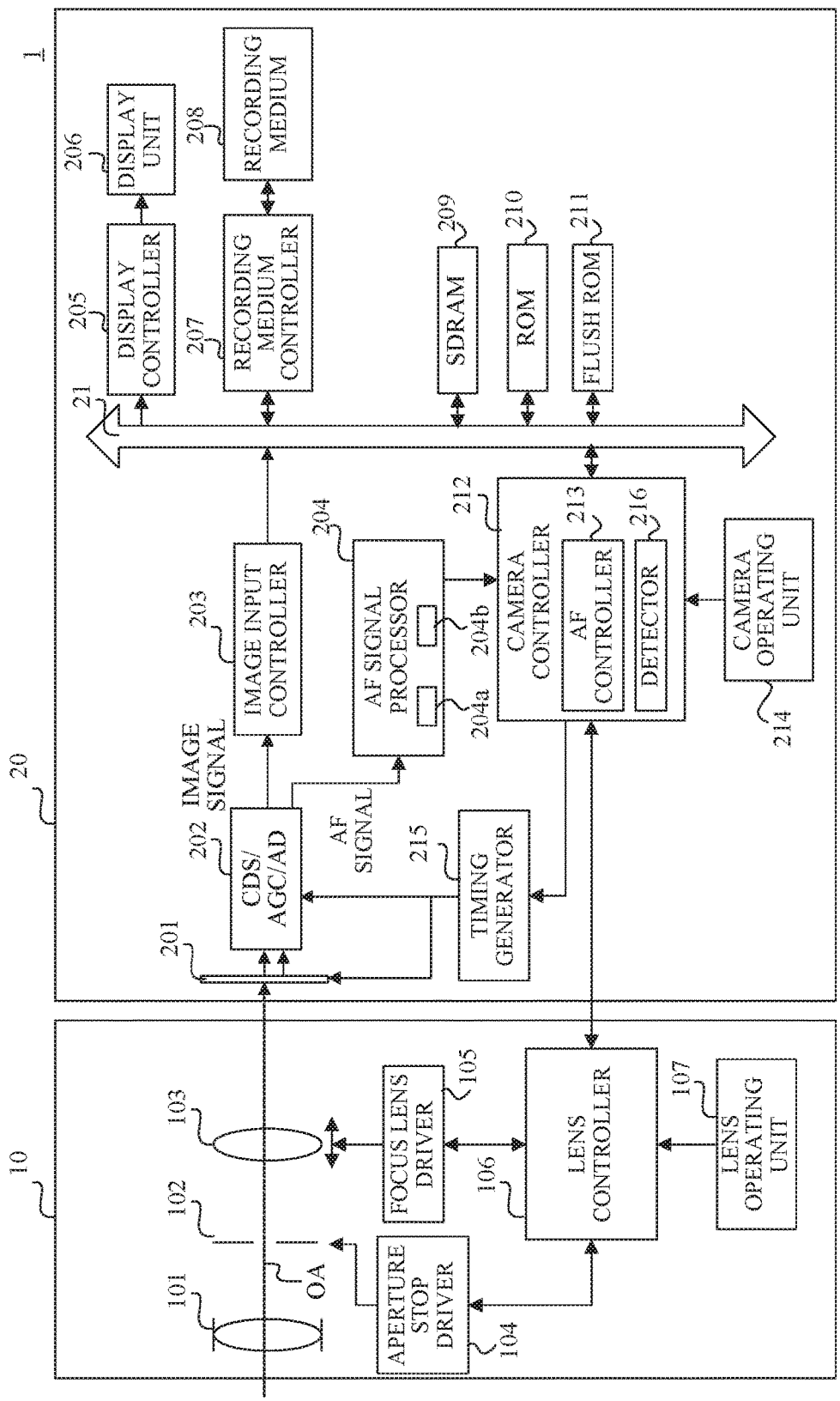
FIG. 1 is a block diagram of an image capturing apparatus according to this embodiment.

Referring now to FIG. 1, a description will be given of an image capturing apparatus according to this embodiment. FIG. 1 is a block diagram of an image capturing apparatus 1 (lens interchangeable type camera system) according to this embodiment. As illustrated in FIG. 1, the image capturing apparatus 1 includes an interchangeable lens 10 (lens apparatus) and a camera body 20 (image capturing apparatus body). A lens controller 106 that integrally controls an entire operation of the interchangeable lens 10 communicates with a camera controller 212 that integrally controls an entire operation of the camera body 20.

A description will now be given of a configuration of the interchangeable lens 10. The interchangeable lens 10 includes a fixed lens 101, an aperture stop (diaphragm) 102, a focus lens 103, a aperture stop driver 104, a focus lens driver 105, a lens controller 106, and a lens operating unit 107. The fixed lens 101, the aperture stop 102, and the focus lens 103 constitute an image capturing optical system. The aperture stop 102 is driven by an aperture stop driver 104, and controls an incident light quantity on an image sensor 201, which will be described later. The focus lens 103 is driven in a direction (optical axis direction) along the optical axis OA by a focus lens driver 105, and adjusts a focus (focus control) imaged on the image sensor 201, which will be described later. The aperture stop driver 104 and the focus lens driver 105 is controlled by the lens controller 106, and determines the F-number of the aperture stop 102 and the position of the focus lens 103 in the optical axis direction. The lens operating unit 107 is operated by a user. When the lens operating unit 107 is operated by the user, the lens controller 106 provides a control in accordance with an operation of the user. The lens controller 106 controls the aperture stop driver 104 and the focus lens driver 105 in accordance with a control command and control information received from a camera controller 212, which will be described later, and sends lens control information to the camera controller 212.

Next follows a description of the configuration of the camera body 20. The camera body 20 can acquire an image signal (image data) from a light flux that has passed the image capturing optical system in the interchangeable lens 10. The camera body 20 includes a bus 21, an image sensor 201, a CDS/AGC/AD converter 202, an image input controller 203, an AF signal processor 204, a display controller 205, and a display unit 206. The camera body 20 further includes a recording (storage) medium controller 207, a recording (storage) medium 208, a SDRAM 209, a ROM 210, a flash ROM 211, a camera controller 212, an AF controller 213, a camera operating unit 214, and a timing generator 215.

The image sensor 201 includes a CCD sensor, a CMOS sensor etc., forms an object image (optical image) formed via the image capturing optical system, on a light receiving surface, and converts an incident light quantity into a signal charge via a photodiode (photoelectrically converts the object image). The signal charge stored in each photodiode is sequentially read out of the image sensor 201 as a voltage signal corresponding to the signal charge, in accordance with a command from the camera controller 212 and based on a driving pulse given by the timing generator 215.

Referring now to FIGS. 2A and 2B, a description will be given of a pixel configuration of the image sensor 201. FIG. 2A schematically illustrates a pixel configuration example that does not correspond to an image capturing plane phase difference AF method, and FIG. 2B schematically illustrates a pixel configuration example that corresponds to the image capturing plane phase difference AF method. The pixel configuration in each of FIGS. 2A and 2B uses a Bayer arrangement, and R is a red color filter, B is a blue color filter, and Gr and Gb are green color filters. In the pixel configuration in FIG. 2B corresponding to the image capturing plane phase difference AF, two photodiodes A and B divided into two in the horizontal direction in FIG. 2B are provided in one pixel (pixel illustrated by a solid line) in the pixel configuration that does not correspond to the image capturing plane phase difference AF method illustrated in FIG. 2A. The photodiodes A and B (first and second photoelectric converters) receive light fluxes that have passed different pupil areas in the image capturing optical system Hence, since the photodiodes A and B receive light fluxes that have passed different areas in an exit pupil in the image capturing optical system, a B image signal has a parallax relative to an A image signal. In addition, among the above image signal (A+B image signal) and a pair of parallax image signals, one of the image signal (A or B image signal) has a parallax. The pixel dividing method illustrated in FIG. 2B is merely illustrative, and another configuration may be adopted, such as a vertically dividing configuration in FIG. 2B and a horizontally and vertically bisecting configuration (totally four divisions). The same image sensor may include a plurality of types of pixels that are divided by different dividing methods.

The image sensor 201 includes two photodiodes A and B in one pixel, as illustrated in FIG. 2B, for the image capturing plane phase difference AF. The image sensor 201 separates the light fluxes from the image capturing optical system into an unillustrated micro lens, forms images through two photodiodes A and B, and take two signals, such as an image signal and a focus detecting signal. A signal (A+B image signal) made by adding the signals from two photodiodes A and B to each other, is the image signal. On the other hand, each of the signals of the photodiodes A and B (two signals or A and B image signals) serves as the focus detecting signal (the image capturing plane phase difference AF signal). The AF signal processor 204 performs a correlation calculation for two image signals based on a focus detecting signal, and calculates or acquires information on an image shift amount and a variety of reliabilities. This embodiment arranges a plurality of photoelectric converters for one micro lens, and a pupil-divided light flux enters each photoelectric converter but the present invention is not limited to this embodiment. For example, the focus detecting pixel configuration may include one PD under the micro lens, and divide a pupil by laterally and vertically shielding light through a light shield layer. A pair of focus detecting pixels may be discretely arranged in a plurality of image capturing pixels and a pair of image signals may be obtained from the pair of focus detecting pixels.

An image signal and a focus detecting signal read out of the image sensor 201 are input into the CDS/AGC/AD converter 202, and perform correlation double sampling for removing reset noises, a gain control, and a signal digitalization. The CDS/AGC/AD converter 202 outputs the image signal to the image input controller 203, and the focus detecting signal (AF signal) to the AF signal processor 204.

The image input controller 203 stores as image data the image signal output from the CDS/AGC/AD converter 202 into the SDRAM 209. The image data stored in SDRAM 209 is displayed on the display unit 206 by the display controller 205 via the bus 21. In a mode used to record the image signal (image data), the recording medium controller 207 records the image data in the recording medium 208. The ROM 210 connected via the bus 21 stores a control program executed by the camera controller 212 and various data necessary for the control. The flash ROM 211 stores various setting information on the operation of the camera body 20 etc., such as user set information.

The AF signal processor 204 (acquirer 204a) acquires an image signal corresponding to an output signal from the image sensor 201 or the AF signal output from the CDS/AGC/AD converter 202 (a first signal (A image signal) and a second signal (B image signal) as a pair of image signals). The AF signal processor 204 (calculator 204b) calculates an image shift amount through a correlation calculation based on the AF signal. The AF signal processor 204 (calculator 204b) calculates reliability information for the AF signal, such as a coincidence between the two images, the sharpness, contrast information, saturation information, and scratch information of the two signals. The image shift amount and the reliability information (reliability and reliability evaluation value) calculated by the AF signal processor 204 are output to the camera controller 212 (AF controller 213).

The camera controller 212 notifies the AF signal processor 204 of a setting change used to calculate the image shift amount and reliability information based on them acquired from the AF signal processor 204. For example, for a large image shift amount, a correlation calculation area may be extended or a type of bandpass filter may be changed in accordance with the contrast information. The camera controller 212 (AF controller 213) calculates a plurality of defocus amounts based on the image shift amount obtained from the AF signal processor 204. The camera controller 212 includes a detector 216 that detects an object having a periodic pattern.

This embodiment extracts totally three signals, such as the image signal (A+B image signal) and focus detecting signals (AF signals i.e., the A image signal and the B image signal) from the image sensor 201, but the present invention is not limited to this embodiment. In order to lessen the burden of the image sensor 201, for example, totally two signals, such as the image signal (A+B image signal) and one of the two focus detecting signals (A image signal), are extracted and a difference between the image signal and the focus detecting signal is calculated, and thereby the other focus detecting signal (B image signal) may be generated.

The camera controller 212 communicates information with each component in the camera body 20 and provides controls. The camera controller 212 provides processes in the camera body 20 and executes a variety of camera functions operated by the user in accordance with the input signal from the camera operating unit 214, such as power on/off, a setting change, a recording start, an AF control start, and a confirmation of a recorded image. As described above, the camera controller 212 communicates information with the lens controller 106 in the interchangeable lens 10, sends the control command and control information to the interchangeable lens 10 and obtains the information from the interchangeable lens 10. The AF controller 213 in the camera controller 212 is a characteristic part of this embodiment, and provides an in-focus control for the object.

Figure 5:
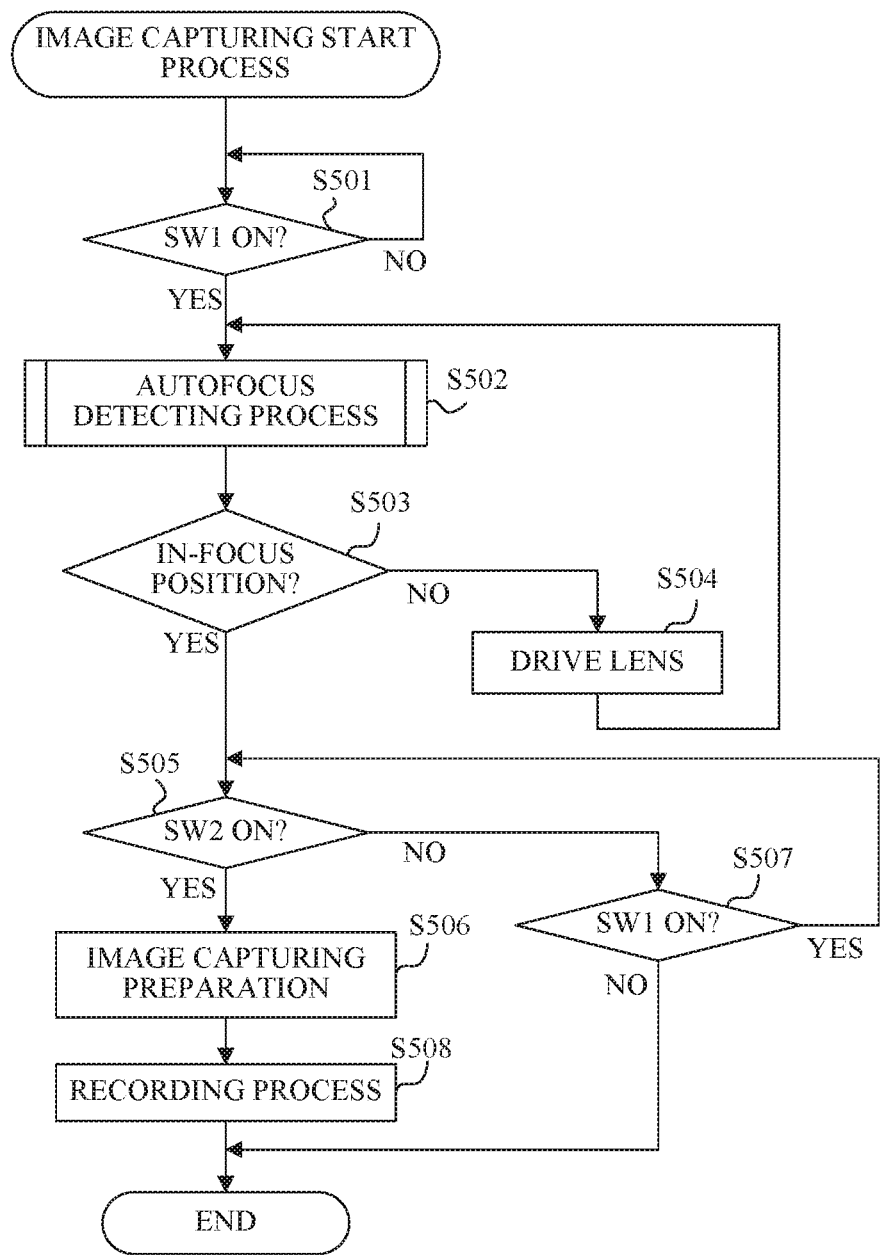
FIG. 5 is a flowchart of an image capturing process according to this embodiment.

Referring now to FIG. 5, a description will be given of an image capturing process according to this embodiment. FIG. 5 is a flowchart of the image capturing process. Each step in FIG. 5 is executed mainly based on a command of the camera controller 212.

Initially, in the step S501, the camera controller 212 determines whether or not a first switch (SW1) for image capturing has turned on. When SW1 turns off, the camera controller 212 stands by and repeats the determination in the step S501. On the other hand, when SW1 turns on, the flow moves to the step S502. In the step S502, the AF controller 213 and the AF signal processor 204 perform the AF detecting process. The details of the AF detecting process will be described later.

Next, in the step S503, the AF controller 213 obtains focus detecting information, and determines whether or not the focus detecting result calculated in the step S502 is the in-focus position or whether the focus detecting result exhibits the in-focus range. When the focus detecting result reveals the defocus range, the flow moves to the step S504. In the step S504, the AF controller 213 drives the lens. In other words, the AF controller 213 sends the driving command of the focus lens 103 to the lens controller 106. Thereby, the AF controller 213 provides a control so as to drive the focus lens 103 based on the focus detecting result calculated by the step S502.

On the other hand, when the focus detecting result reveals the in-focus range in the step S503, the flow moves to the step S505. In the step S505, the camera controller 212 determines whether or not the second switch (SW2) for image capturing has turned on. When the SW2 turns off, the flow moves to the step S507. In the step S507, the camera controller 212 determines whether or not the SW1 has turned on. When the SW1 turns on, the flow returns to the step S505. On the other hand, when the SW1 turns off, this flow (image capturing process) ends. When the SW2 turns on in the step S505, the flow moves to the step S506. In the step S506, the camera controller 212 provides an image capturing preparation process. Next, in the step S508, the camera controller 212 ends the image capturing process by the recording process of the captured image data.

Figure 6:
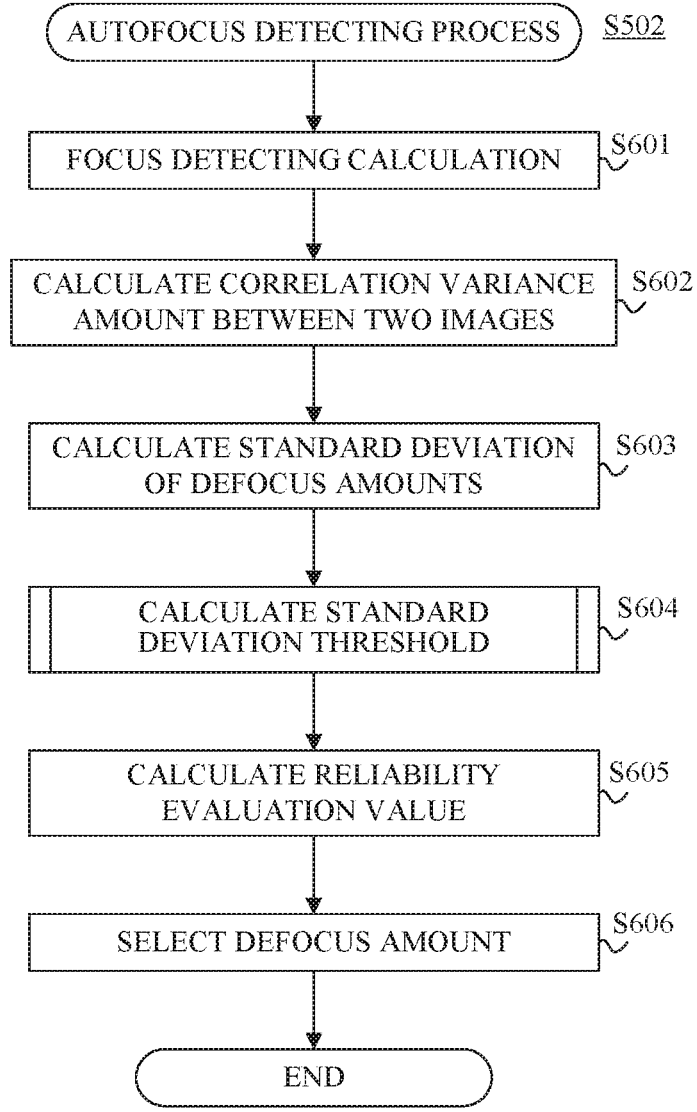
FIG. 6 is a flowchart of a flowchart of an autofocus (AF) detection process according to this embodiment.

Referring now to FIG. 6, a description will be given of the step S502 (AF detecting process) in FIG. 5. FIG. 6 is a flowchart of the AF detecting process. Each step in FIG. 6 is executed mainly by the AF controller 213 and the AF signal processor 204.

Initially, in the step S601, the AF signal processor 204 provides a correlation operation between a pair of image signals (phase difference signals) obtained from the image sensor 201 based on the command from the AF controller 213, and calculates a correlation amount (focus detecting calculation). The AF controller 213 calculates the defocus amount based on the image shift amount as a shift amount Shift that minimizes the correlation amount received from the AF signal processor 204. At this time, the AF signal processor 204 performs a correlation calculation using three types of filters having different low, mid-range, and high frequency bands (first, second, and third frequency bands), and calculates three types of defocus amounts for low, mid-range, and high bands. The AF signal processor 204 calculates a correlation amount between a pair of image signals (phase difference signals) based on a command from the AF controller 213 for each shift amount Shift. The AF controller 213 generates a waveform of a correlation amount for each shift amount Shift received from the AF signal processor 204.

Figure 3:
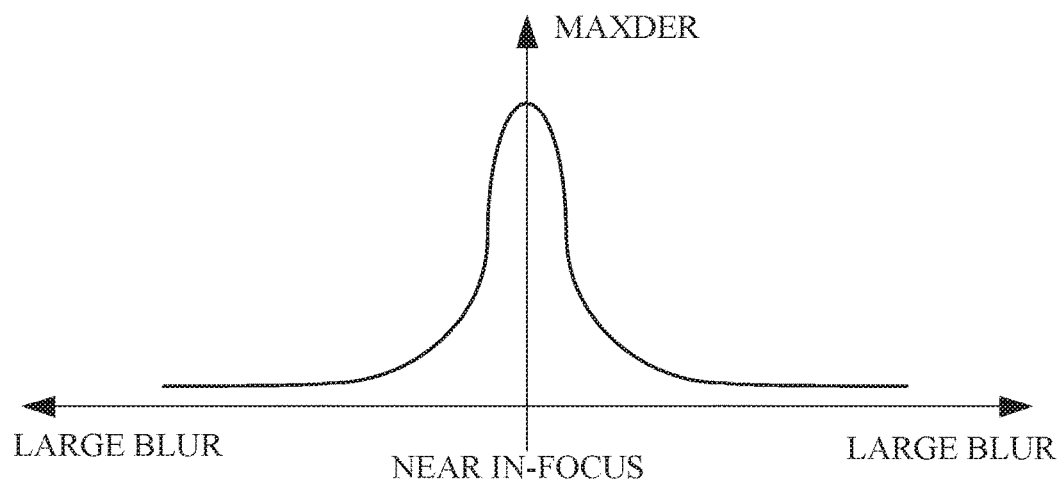
FIG. 3 is an explanatory view of an evaluation value relating to a correlation variation amount between two images according to this embodiment.

Next, in the step S602, the AF controller 213 calculates a correlation variation amount between the two images. FIG. 3 is an explanatory view of an evaluation value relating to a correlation variation amount between the two images, and is a graph illustrating the correlation variation amount in driving the focus lens 103 up to almost the in-focus point from the state with a large blur in the image capturing plane phase difference AF. In FIG. 3, the abscissa axis represents a blur degree of the object, and the ordinate axis represents a correlation variation amount MAXDER. The correlation variation amount MAXDER can be calculated by the following equation (1).

$$\text{MAXDER}(k)=(\text{COR}[k-3]-\text{COR}[k-1])-(\text{COR}[k-2]-\text{COR}[k]) \quad (1)$$

In the expression (1), k is a variable of an integer for specifying a position, and COR[k] is a correlation amount between the two images at the position k. At this time, the AF controller 213 calculates the three types of correlation variation values MAXDER for the low, mid-range, and high filter frequency bands, similar to the step S601. As illustrated in FIG. 3, it is understood that a value of a correlation variation amount becomes larger in the image capturing plane phase difference AF as a state with a large blur approaches to an in-focus point.

Next, in the step S603 in FIG. 6, the AF controller 213 calculates a standard deviation Defocus3σ the defocus amount based on the correlation variation amount MAXDER. The standard deviation Defocus3σ of the defocus amount can be calculated as follows.

$$\text{Defocus}3\sigma = K \times (A \times \text{MAXDER}^B) \quad (2)$$

In the expression (2), K is a conversion coefficient used to convert an image shift amount into a defocus amount, and A and B are coefficients in the conversion expression for converting the correlation variation amount MAXDER into the standard deviation of the image shift amount. At this time, the AF controller 213 calculates the standard deviation Defocus3σ of the three types of defocus amounts by substituting for the three types of correlation variation amounts MAXDER for the different low, mid-range, and high frequency bands calculated in the step S603.

Next, in the step S604, the AF controller 213 calculates thresholds of the standard deviation Defocus3σ of the calculated defocus amounts so as to calculate the reliability evaluation value Rel representing the information on the reliability of the defocus amount. This embodiment determines the reliability evaluation Rel by four stages in high reliability order of the reliability evaluation value Rel3, the reliability evaluation value Rel2, the reliability evaluation value Rel1, and the reliability evaluation value Rel0. This embodiment sets the reliability evaluation value Rel2 to a first reference reliability, and the reliability evaluation value Rel0 to a second reference reliability lower than the first reference reliability.

Assume that the reliability evaluation value Rel3 is a condition that can provide an in-focus since the defocus amount has a high reliability. Assume that the reliability evaluation Rel2 is a condition that can provide an in-focus when an average value of a plurality of defocus amounts calculated with the defocus amount(s) for past m frames (at least one past frame and the current frame is equal to or smaller than a predetermined value. Assume that the reliability evaluation value Rel1 means that the calculated defocus amounts have aligned directions, and the reliability evaluation value Rel0 means that the defocus amount has the lowest reliability. Each of the reliability evaluation values Rel1 and Rel0 is a condition that cannot provide an in-focus. However, this embodiment is not limited to this example, and the setting number and condition of the reliability evaluation value may be changed.

When the standard deviation Defocus3σ of the calculated defocus amount is larger than a standard deviation threshold Def3σTH1, the AF controller 213 selects the reliability evaluation value Rel0. When the standard deviation Defocus3σ of the calculated defocus amount is larger than a standard deviation threshold Def3σTH2 and equal to or smaller than the standard deviation threshold Def3σTh1, the AF controller 213 selects the reliability evaluation value Rel1. When the standard deviation Defocus3σ of the calculated defocus amount is larger than a standard deviation threshold Def3σTH3 and equal to or smaller than the standard deviation threshold. Def3σTH2, the AF controller 213 selects the reliability evaluation value Rel2. Otherwise, the AF controller 213 selects the reliability evaluation value Rel3.

Figure 4:
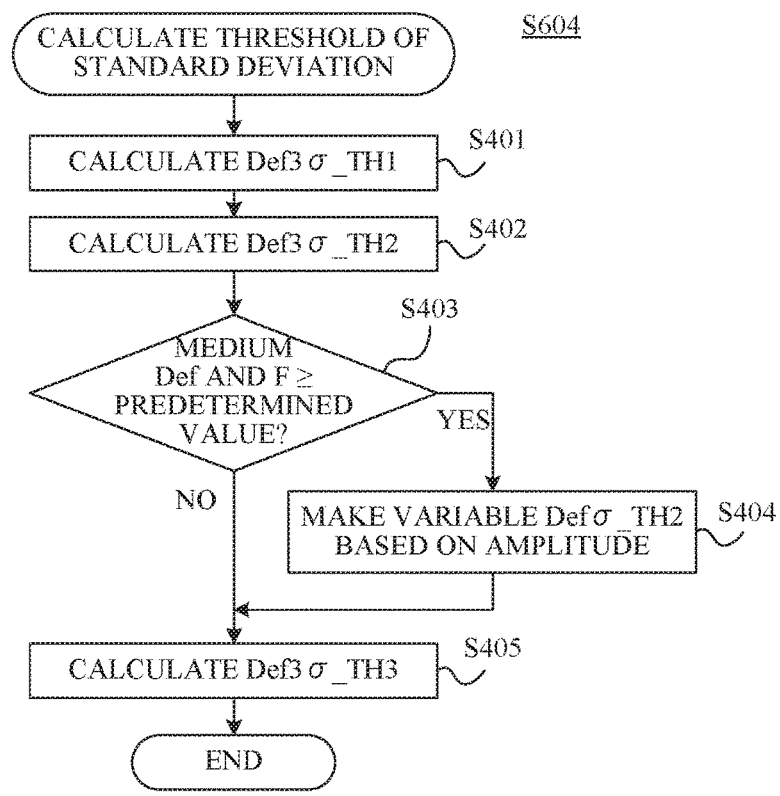
FIG. 4 is a flowchart of a calculation method of a standard deviation threshold according to this embodiment.

Referring now to FIG. 4, a description will be given of a method for calculating the threshold of the standard deviation Defocus3σ in the step S604. FIG. 4 is a flowchart of the calculating method of the threshold of the standard deviation Defocus3σ. Each step in FIG. 4 is executed mainly by the AF controller 213.

Initially, in the step S401, the AF controller 213 calculates the threshold of the standard deviation (standard deviation threshold Def3σTH1). A preset value is set to the standard deviation threshold Def3TH1. Next, in the step S402, the AF controller 213 calculates the standard deviation threshold Def3σTH2. The standard deviation threshold Def3σTH2 is a value smaller than the standard deviation threshold Def3σTH1.

Next, in the step S403, the AF controller 213 determines whether or not the standard deviation threshold for the mid-range defocus amount has been calculated, and whether the F-number F is equal to or larger than a predetermined F_TH. When both conditions are met, the flow moves to the step S404. On the other hand, when at least one of the conditions is not met, the flow moves to the step S405. In other words, in this embodiment, the AF controller 213 changes the first reference reliability (reliability evaluation value Rel2) when the F-number is larger than a first F-number. More specifically, the AF controller 213 changes the threshold (standard deviation threshold Def3σTH2) of the standard deviation used to determine the first reference reliability when the F-number is larger than the first F-number.

Figure 8:
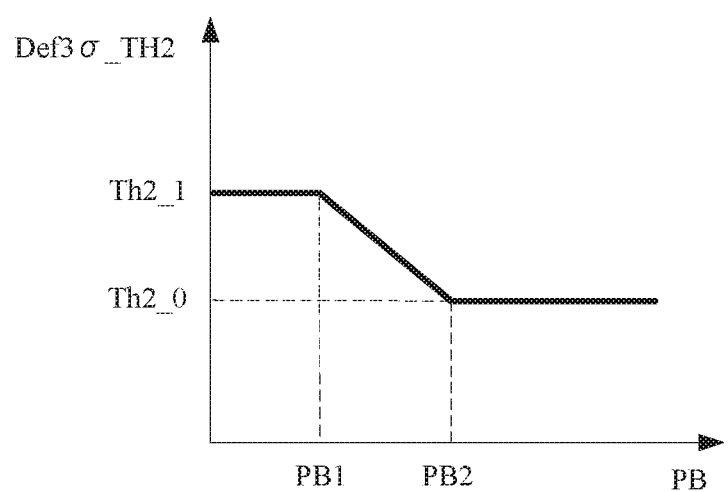
FIG. 8 illustrates a relationship between an amplitude and a standard deviation threshold of a defocus amount according to this embodiment.

In the step S404, the AF controller 213 makes variable the standard deviation threshold Def3σTH2 in accordance with an amplitude PB (luminance evaluation value) as a difference between a maximum value and a minimum value of the image signals. FIG. 8 illustrates a relationship between the amplitude PB and the standard deviation threshold Def3σTH2. In FIG. 8, the abscissa axis represents the amplitude PB, and the ordinate axis represents the standard deviation threshold Def3σTH2. As illustrated in FIG. 8, when the amplitude PB is smaller than PB1, the standard deviation threshold Def3σTH2 is Th2_1. When the amplitude PB is a value between PB1 and PB2, the standard deviation threshold Def3σTH2 linearly changes between Th2_1 and TH2_0. When the amplitude PB is larger than PB2, the standard deviation threshold Def3σTH2 is Th2_0.

Thus, the AF controller 213 changes the threshold (Def3σTH2) of the standard deviation used to determine the first reliability (reliability evaluation value Rel2) based on the luminance evaluation value of the image signal (first or second signal). The AF controller 213 may set the threshold of the standard deviation to the first standard deviation threshold (Th2_0) when the luminance evaluation value (PB) is the first luminance evaluation value (PB1). When the luminance evaluation value is the second luminance evaluation value (PB1) lower than the first luminance evaluation value, the AF controller 213 sets the threshold of the standard deviation to the second threshold deviation threshold higher than the first standard deviation threshold (Th2_1). This embodiment sets the luminance evaluation value to the amplitude of the image signal (first or second signal), but is not limited to this example and may be the maximum value or the minimum value of the image signal or the object luminance. The amplitude PB is a value that depends on the object luminance. When the amplitude PB is small, the object luminance is low. Thus, when the amplitude PB is small, the standard deviation threshold Def3σTH2 is increased so as to increase the reliability evaluation value Rel.

In the step S405, the AF controller 213 calculates the standard deviation threshold Def3σTH3. The standard deviation threshold Def3τTH3 is a value smaller than the standard deviation threshold Def3σTH2. Thereby, the in-focus rate can be improved in capturing a low luminance object image with a small aperture.

Next, in the step S605 in FIG. 6, the AF controller 213 calculates the reliability evaluation value Rel representing the reliability of the calculated defocus amount. More specifically, the AF controller 213 calculates the reliabilities of the three types of defocus amounts for the low, mid-range, and high ranges calculated in the step S601 based on the standard deviation thresholds Def3σTH1, Def3σTH2, and Def3σTH3.

Next, in the step S606, the AF controller 213 selects one defocus amount based on the three types of defocus amounts for the low, mid-range, and high ranges calculated in the step S601 and the reliability calculated in the step S605. Hereinafter, assume that a large Def is a defocus amount calculated via the low filter, a medium Def is a defocus amount calculated via the mid-range filter, and a small Def is a defocus amount calculated via the high filter.

Figure 7:
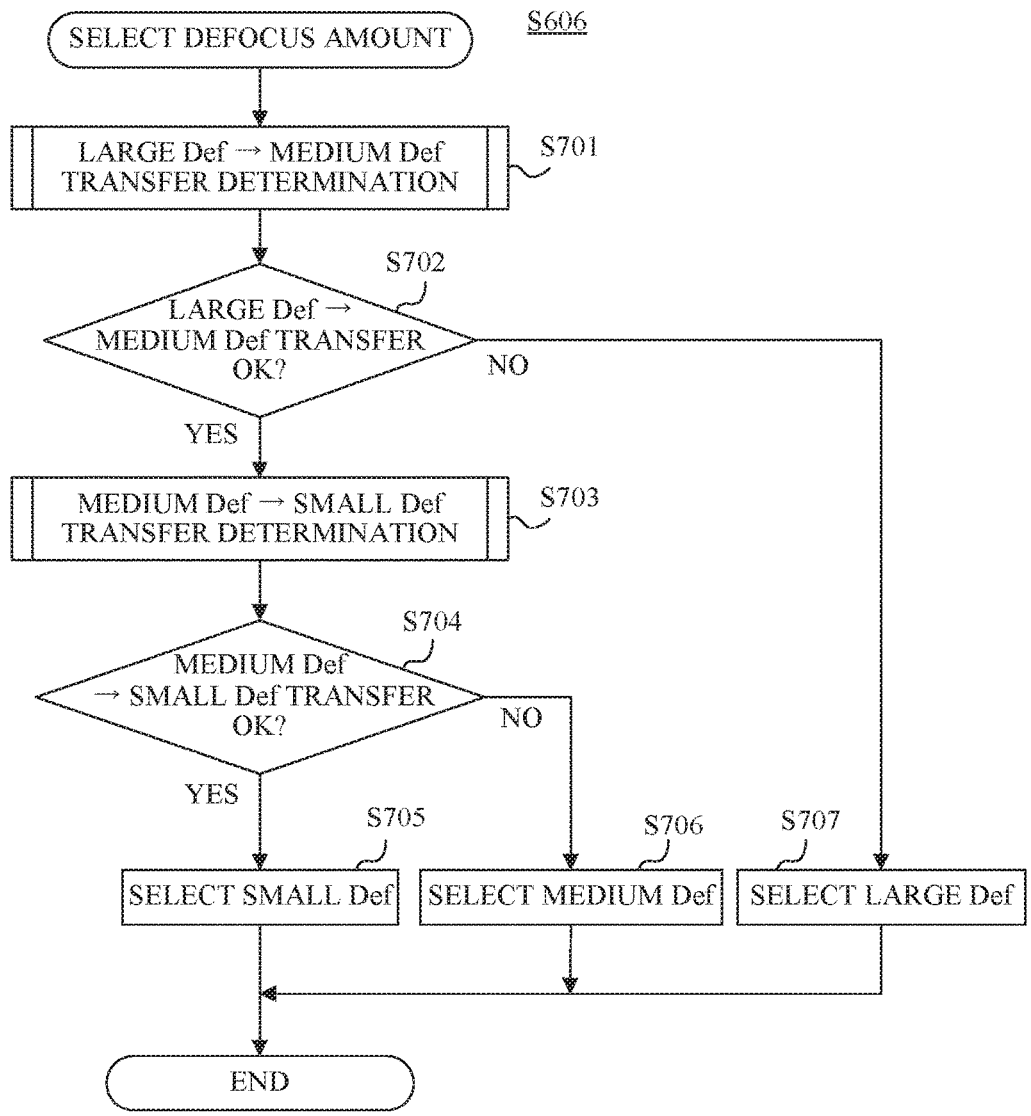
FIG. 7 is a flowchart of a selection method of a defocus amount according to this embodiment.

Referring now to FIG. 7, a description will be given of a defocus amount selecting method (the step S606 in FIG. 6). FIG. 7 is a flowchart of the defocus amount selecting method. Each step in FIG. 7 is executed mainly by the AF controller 213.

Initially, in the step S701, the AF controller 213 determines a transfer from the large Def (first defocus amount), which will be described later, to the medium Def (second defocus amount). Next, in the step S702, the AF controller 213 determines whether the transfer from the large Def to the medium Def has been succeeded. When the transfer from the large Def to the medium Def has been succeeded, the flow moves to the step S703. On the other hand, when the transfer from the large Def to the medium Def has failed, the flow moves to the step S707.

In the step S703, the AF controller 213 determines the transfer from the medium Def (second defocus amount), which will be described later, to the small Def (third defocus amount). Next, in the step S704, the AF controller 213 determines whether the medium Def to the small Def has been succeeded. When the transfer from the middle Def to the small Def has been succeeded, the flow moves to the step S705. On the other hand, when the transfer from the middle Def to the small Def has failed, the flow moves to the step S706.

In the step S705, the AF controller 213 selects the small Def as the defocus amount used to drive the focus lens 103 (focus control), and ends this flow. In the step S706, the AF controller 213 selects the medium Def as the defocus amount used for the focus control, and ends this flow. In the step S707, the AF controller 213 selects the large Def as the defocus amount used for the focus control, and ends this flow.

Figure 9:
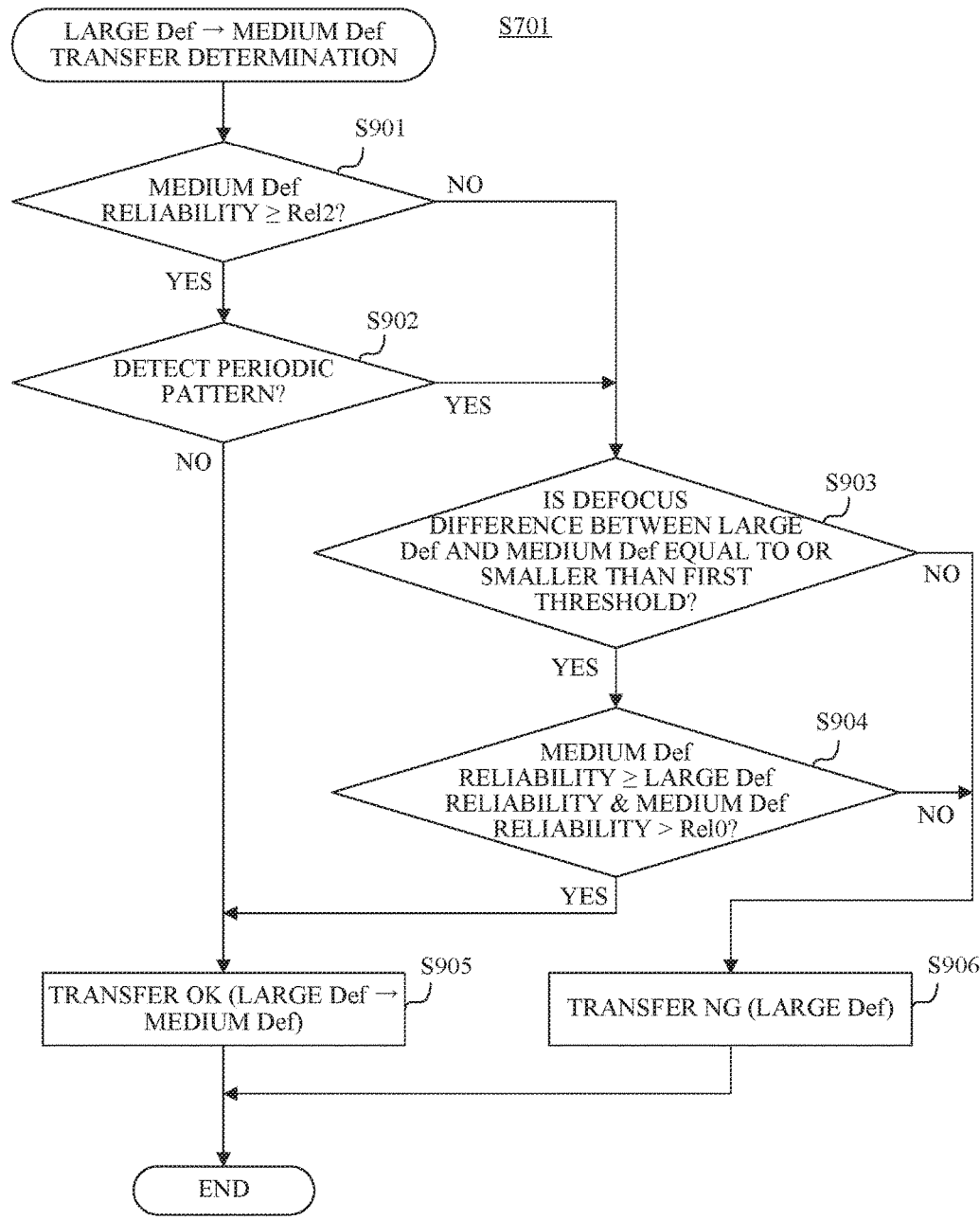
FIG. 9 is a flowchart of a transfer determination from a large Def to a medium Def according to this embodiment.

Referring now to FIG. 9, a description will be given of the transfer determination from the large Def to the medium Def (the step S701 in FIG. 7). Each step in FIG. 9 is executed mainly by the camera controller 212 (AF controller 213 or the detector 216).

Initially, in the step S901, the AF controller 213 determines whether the reliability of the medium Def (reliability evaluation value) is equal to or larger than the reliability evaluation value Rel2. The determination of the step S901 can make more likely the transfer to the medium Def even for the low contrast object and improve the in-focus rate. When the reliability of the medium Def is equal to or larger than the reliability evaluation value Rel2, the flow moves to the step S902. When the reliability of the medium Def is smaller than the reliability evaluation value Rel2, the flow moves to the step S903.

In the step S902, the camera controller 212 (detection 216) determines whether the object having a periodic or cyclic pattern has been detected. The object having the periodic pattern has a low reliability of the defocus amount. Hence, when the object having the periodic pattern has been detected, the transfer from the large Def to the medium Def is prevented. A part that minimizes the correlation amount as an in-focus point candidate periodically appears in the waveform representing the correlation amount of the object having the periodic pattern. For example, this determination method calculates a correlation variation amount between the two images for each in-focus point candidate, and compares a calculated difference of the correlation variation amount between the two images with the threshold. When the object having the periodic pattern has been detected, the flow moves to the step S903. On the other hand, when the object having the periodic pattern has not yet been detected, the flow moves to the step S905.

In the step S903, the AF controller 213 determines whether the difference of the defocus amount between the large Def and the medium Def is equal to or smaller than a first depth threshold (first threshold). When the difference of the defocus amount between the large Def and the medium Def is equal to or smaller than the first depth threshold, the flow moves to the step S904. When this difference is larger than the first depth threshold, the flow moves to the step S906. The first depth threshold is set, for example, to an amount nine times as large as the depth of focus for the proper transfer from the large Def and the medium Def. This configuration can set a uniform threshold even when the F-number value and the focus detecting area vary, by setting the first depth threshold based on the depth of focus (by making the first depth threshold larger than the depth of focus).

In the step S904, the AF controller 213 determines whether the reliability of the medium Def (second reliability) is equal to or larger than the reliability of the large Def (first reliability) and whether the reliability of the medium Def is higher than the reliability evaluation value Rel0. When both conditions are met, the flow move to the step S905. On the other hand, when at least one condition is not met, the flow moves to the step S906.

In the step S905, the AF controller 213 determines whether the transfer from the large Def to the medium Def is performed, and ends this flow. On the other hand, in the step S906, the AF controller 213 determines that the transfer from the large Def to the medium Def can be performed, and ends this flow. Thereby, while the focus lens 103 is moved from the large blur state to the small blur state, whether the transfer from the large Def to the medium Def is available can be determined based on the difference of the defocus amount between the large Def and the medium Def and their reliabilities.

In FIG. 9, this embodiment may add the step of determining whether the F-number is larger than a predetermined F-number (second F-number). When the F-number is larger than the predetermined F-number, the AF controller 213 selects the defocus amount (second defocus amount) of the medium Def as the defocus amount used for focusing.

Figure 10:
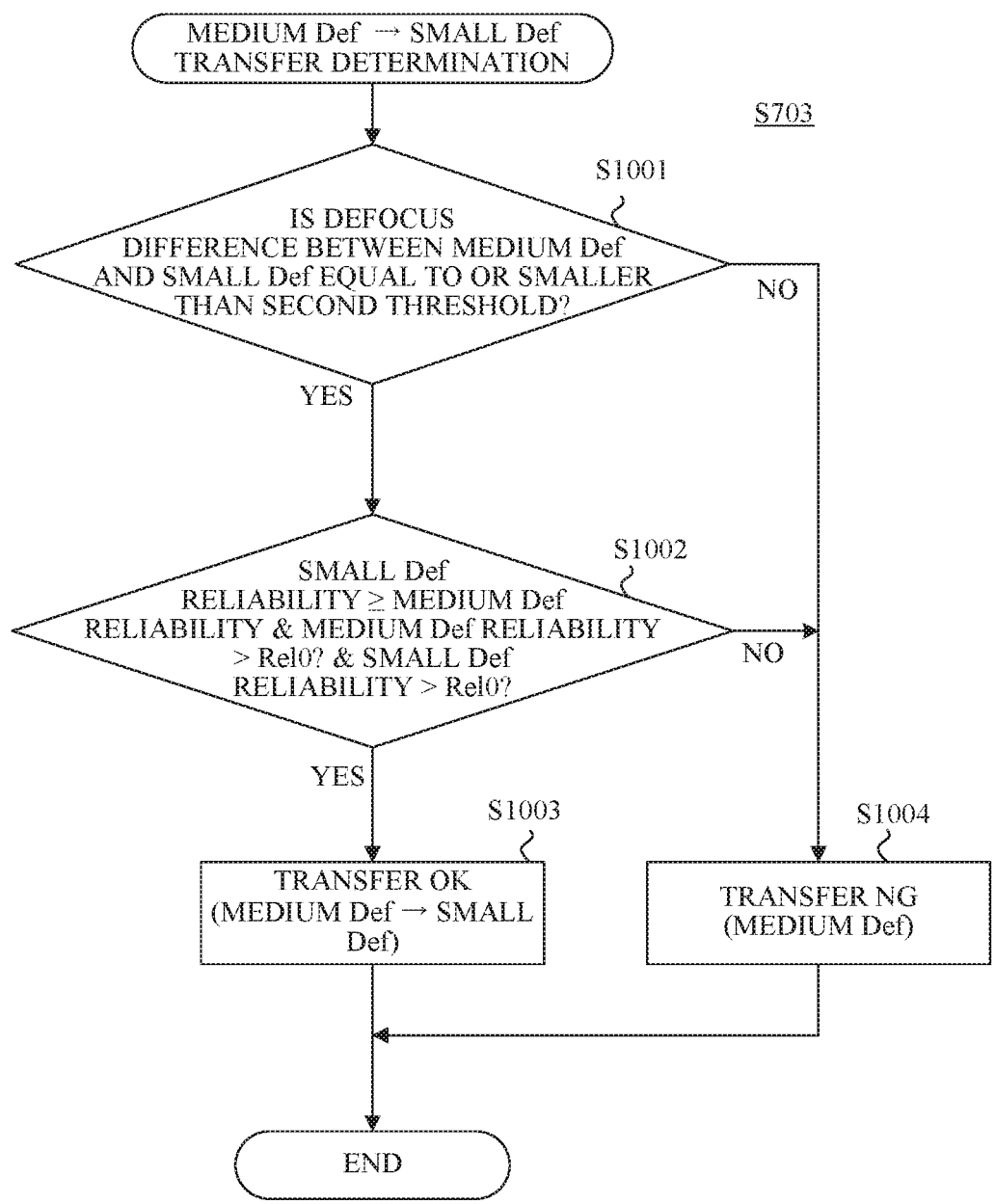
FIG. 10 is a flowchart of a transfer determination from a medium Def to a small Def according to this embodiment.

Referring now to FIG. 10, a description will be given of the transfer determination from the medium Def to the small Def (the step S703 in FIG. 7). Each step in FIG. 10 is mainly executed by the AF controller 213.

Initially, in the step S1001, the AF controller 213 determines whether or not the difference of the defocus amount between the medium Def and the small Def is equal to or smaller than a second preset depth threshold (second threshold). When the difference of the defocus amount between the medium Def and the small Def is equal to or smaller than the second depth threshold, the flow moves to the step S1002. On the other hand, when the difference is larger than the second depth threshold, the flow moves to the step S1004. For example, the second depth threshold is set to an amount three times as large as the focus of depth for proper transfer from the medium Def to the small Def. This configuration can set a uniform threshold even when the F-number and the focus detecting area vary by setting the second depth threshold based on the depth of field (or by making the second depth threshold larger than the depth of field). The second depth threshold is set to a value smaller than the first depth threshold used to determine the step S903 in FIG. 9. This is because as the small Def is varied to the large Def through the medium Def, the detection scattering of the defocus amount increases and consequently the difference between the medium Def and the large Def is larger than the difference between the small Def and the medium Def.

In the step S1002, the AF controller 213 determines whether or not the reliability of the small Def (reliability evaluation value) is equal to or larger than the reliability of the medium Def and whether each of the reliability of the small Def and the reliability of the medium Def is higher than the reliability evaluation value Rel0. When all of these conditions are satisfied, the flow moves to the step S1003. On the other hand, when at least one condition is not satisfied, the flow moves to the step S1004.

In the step S1003, the AF controller 213 determines that the transfer from the medium Def to the small Def is available, and ends this process. On the other hand, in the step S1004, the AF controller 213 determines that the transfer from the medium Def to the small Def is unavailable, and ends this flow. Thereby, while the focus lens 103 is moved from the small blur state to the in-focus position, whether a transfer from the medium Def to the small Def is available can be determined based on the difference of the defocus amount between the medium Def and the small Def and their reliabilities.

Thus, the control apparatus according to this embodiment includes the AF signal processor 204 (acquirer 204a, calculator 204b) and the AF controller 213. The acquirer acquires a first signal (A image signal) and a second signal (B image signal) corresponding to the light fluxes that have passed different pupil areas in the image capturing optical system. The calculator performs a plurality of different filter process (band-pass filter process) having different bands for the first and second signals, and calculates a plurality of image shift amounts and a plurality of reliabilities based on the first signal and the second signal after each filter process. The controller determines the defocus amount used for the focusing (focus control) among a plurality of defocus amounts based on a difference between the plurality of defocus amounts calculated with the plurality of image shift amounts and at least one of the plurality of reliabilities. The calculator calculates the first defocus amount (large Def) based on the first signal and the second signal in the first frequency band. The calculator calculates the second defocus amount (medium Def) and the second reliability (medium Def reliability) based on the first signal and the second signal in the second frequency band higher than the first frequency band. The controller selects the second defocus amount as the defocus amount used for the focusing (S901) when the second reliability is equal to or higher than the first reference reliability (equal to or higher than the reliability evaluation value Rel2, i.e., Rel2 or Rel3).

The control apparatus may include a detector 216 configured to detect an object having a periodic pattern. The controller selects the second defocus amount to the defocus amount used for focusing when the detector does not detect the object having the periodic pattern (S902). The calculator may calculate the reliability based on the defocus standard Defocus3σ of the defocus amount relating to the correlation variation amount between the first and second signals. The calculator may calculate the reliability by comparing the defocus standard Defocus3σ of the defocus amount with the thresholds Defocus3σTH1, TH2, and TH3 of the standard deviation.

While the focus lens is moved from the large blur state to the in-focus state, this embodiment determines the direction of the in-focus position in the large blur state and applies an accurate defocus amount near the in-focus position so as to improve the in-focus accuracy and to reduce the AF time. This embodiment can reduce image capturing scenes in the non-in-focus state so as to prevent a focus of a blurred image, and increase image capturing scenes that can be accurately focused.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (MID), or Blu-ray Disc (BD)™), a flash memory device, a memory card, and the like.

This embodiment can provide a control apparatus, an image capturing apparatus, a control method, and a storage medium, which can provide an accurate focus control in capturing a low luminance or low contrast object.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-085061, filed on Apr. 24, 2017, which is hereby incorporated by reference herein in its entirety.

What is claimed is:

1. An image capturing apparatus that acquires a first signal and a second signal corresponding to light fluxes that have passed different pupil areas in an image capturing system, the image capturing apparatus comprising:
a memory device that stores a set of instructions; and
at least one processor that executes the set of instructions to function as:
a calculator configured to calculate a first defocus amount based on the first signal and the second signal in a first frequency band after each filter process by a plurality of filter processes having different bands for the first signal and the second signal, and to calculate a second defocus amount and a first reliability based on the first signal and the second signal in a second frequency band higher than the first frequency band, wherein the calculator calculates the first reliability based on a standard deviation of a plurality of defocus amounts relating on a correlation variation amount between the first signal and the second signal; and
a controller configured to select a defocus amount used for focusing among the plurality of defocus amounts based on the first reliability,
wherein the controller selects the second defocus amount as the defocus amount used for the focusing when the first reliability is equal to or higher than a first reference reliability.

2. The control apparatus according to claim 1, wherein the first reference reliability is a reference reliability that can provide an in-focus when an average value of a plurality of defocus amounts calculated with a past frame and a current frame is equal to or lower than a predetermined value.

3. The control apparatus according to claim 1, wherein the at least one processor further functions as a detector configured to detect an object having a periodic pattern,
wherein the controller selects the second defocus amount as the defocus amount used for the focusing when the first reliability is equal to or higher than the first reference reliability and when the detector does not detect the object.

4. The control apparatus according to claim 1, wherein the controller selects the first defocus amount as the defocus amount used for the focusing when the first reliability is equal to or higher than the first reference reliability and when a difference between the first defocus amount and the second defocus amount is larger than a first threshold.

5. The control apparatus according to claim 4, wherein the calculator calculates a second reliability based on the first signal and the second signal in the first frequency band,
wherein when the first reliability is equal to or higher than the first reference reliability, the first reliability is higher than the second first reliability, and the first reliability is higher than a second reference reliability, the controller selects the second defocus amount as the defocus amount used for the focusing,
wherein when the first reliability is equal to or higher than the first reference reliability and the first reliability is lower than the second reliability or the first reliability is equal to or lower than the second reference reliability, the controller selects the first defocus amount as the defocus amount used for the focusing, and
wherein the second reference reliability is lower than the first reference reliability.

6. The control apparatus according to claim 5, wherein the calculator calculates a third defocus amount and a third reliability based on the first signal and the second signal in a third frequency band higher than the second frequency band, and
wherein the controller selects the second defocus amount as the defocus amount used for the focusing when a difference between the second defocus amount and the third defocus amount is larger than a second threshold.

7. The control apparatus according to claim 6, wherein the controller selects the third defocus amount as the defocus amount used for the focusing when the third reliability is higher than the first reliability and when each of the first reliability and the third reliability is higher than the second reference reliability, and
wherein the controller selects the second defocus amount as the defocus amount used for the focusing when the third reliability is lower than the first reliability or when the first reliability or the third reliability is lower than the second reference reliability.

8. The control apparatus according to claim 1, wherein the controller changes the first reference reliability when a F-number is larger than a first F-number.

9. The control apparatus according to claim 1, wherein the calculator calculates the fit reliability by comparing the standard deviation of the defocus amount with a threshold of the standard deviation.

10. The control apparatus according to claim 9, wherein the controller changes the threshold of the standard deviation used to determine the first reference reliability when a F-number is higher than a first F-number.

11. The control apparatus according to claim 9, wherein the controller changes the threshold of the standard deviation used to determine the first reference reliability based on a luminance evaluation value of the first signal or the second signal.

12. The control apparatus according to claim 11, wherein the controller sets the threshold of the standard deviation to a first standard deviation threshold when the luminance evaluation value is a first luminance evaluation value, and
wherein the controller sets the threshold of the standard deviation to a second standard deviation threshold higher than the first standard deviation threshold when the luminance evaluation value is lower than a second luminance evaluation value lower than the first luminance evaluation value.

13. The control apparatus according to claim 11, wherein the luminance evaluation value is an amplitude, a maximum value, or a minimum value of the first signal or the second signal, or an object luminance.

14. The control apparatus according to claim 1, wherein the controller selects the second defocus amount as the defocus amount used for the focusing when a F-number is larger than a second F-number.

15. An image capturing apparatus that acquires a first signal and a second signal corresponding to output signals from a first photoelectric converter and a second photoelectric converter, the image capturing apparatus comprising:
an image sensor that includes the first photoelectric converter and the second photoelectric converter configured to receive light fluxes that have passed different pupil areas in an image capturing optical system;

a memory device that stores a set of instructions; and
at least one processor that executes the set of instructions to function as:
a calculator configured to calculate a first defocus amount based on the first signal and the second signal in a first frequency band after each filter process by a plurality of filter processes having different bands for the first signal and the second signal, and to calculate a second defocus amount and a first reliability based on the first signal and the second signal in a second frequency band higher than the first frequency band, wherein the calculator calculates the first reliability based on a standard deviation of a plurality of defocus amounts relating on a correlation variation amount between the first signal and the second signal; and
a controller configured to select a defocus amount used for focusing among th plurality of defocus amounts based on the first reliability,
wherein the controller selects the second defocus amount as the defocus amount used for the focusing when the first reliability is equal to or higher than a first reference reliability.

16. A control method comprising:
an acquiring step configured to acquire a first signal and a second signal corresponding to light fluxes that have passed different pupil areas in an image capturing optical system;
a calculating step configured to calculate a first defocus amount based on the first signal and the second signal in a first frequency band after each filter process by a plurality of filter processes having different bands for the first signal and the second signal, and to calculate a second defocus amount and a first reliability based on the first signal and the second signal in a second frequency band higher than the first frequency band, wherein the calculating step calculates the first reliability based on a standard deviation of a plurality of defocus amounts relating on a correlation variation amount between the first signal and the second signal; and
a selecting step configured to select a defocus amount used for focusing among the plurality of defocus amounts based on the first reliability,
wherein the selecting step selects the second defocus amount as t defocus amount used for the focusing when the first reliability is equal to or higher than a first reference reliability.

17. A non-transitory storage medium storing a program that enables a computer to execute a control method that includes:
an acquiring step configured to acquire a first signal and a second signal corresponding to light fluxes that have passed different pupil areas in an image capturing optical system;
a calculating step configured to calculate a first defocus amount based on the first signal and the second signal in a first frequency band after each filter process by a plurality of filter processes having different bands for the first signal and the second signal, and to calculate a second defocus amount and a first reliability based on the first signal and the second signal in a second frequency band higher than the first frequency band, wherein the calculating step calculates the first reliability based on a standard deviation of a plurality of defocus amounts relating on a correlation variation amount between the first signal and the second signal; and
a selecting step configured to select a defocus amount used for focusing among the plurality of defocus amounts based on the first reliability,
wherein the selecting step selects the second defocus amount as the defocus amount used for the focusing when the first reliability is equal to or higher than a first reference reliability.

* * * * *